United States Patent
Tanigaki et al.

Patent Number: 6,096,245
Date of Patent: Aug. 1, 2000

[54] RESIN COMPOSITIONS, RESIN MOLDINGS AND THEIR METHODS OF PRODUCTION

[75] Inventors: Tsuyoshi Tanigaki, Kariya; Shogo Izawa, Tokai; Akikazu Matsumoto, Toyota; Tadahiko Kohama, Nishio, all of Japan

[73] Assignee: Aisin Seiki Kabushiki Kaisha, Kariya, Japan

[21] Appl. No.: 09/131,337

[22] Filed: Aug. 7, 1998

[51] Int. Cl.$^7$ ....................................... H01B 1/02

[52] U.S. Cl. ................. 252/512; 252/500; 252/518.1; 252/511; 428/195; 428/208; 420/557; 420/560; 264/669

[58] Field of Search .................... 252/512–518.1, 252/519.3, 511, 500; 428/208, 195; 427/157; 420/557, 560; 264/669

[56] References Cited

U.S. PATENT DOCUMENTS

| | | | |
|---|---|---|---|
| 4,545,926 | 10/1985 | Fouts, Jr. et al. | 252/511 |
| 4,853,155 | 8/1989 | Kurasawa | 252/512 |
| 5,084,211 | 1/1992 | Kawakita et al. | 252/511 |
| 5,652,042 | 7/1997 | Kawakita et al. | 428/209 |
| 5,830,389 | 11/1998 | Capote et al. | 252/512 |
| 5,866,044 | 2/1999 | Saraf et al. | 252/519.31 |

FOREIGN PATENT DOCUMENTS

| | | |
|---|---|---|
| 3724396 | 2/1988 | Germany . |
| 4218173 | 12/1992 | Germany . |
| 63-50482 | 3/1988 | Japan . |
| 1-207989 | 8/1989 | Japan . |
| 4-359039 | 12/1992 | Japan . |
| 5-131445 | 5/1993 | Japan . |
| 7-49491 | 5/1995 | Japan . |
| 9-237705 | 9/1997 | Japan . |
| 2 193 721 | 2/1988 | United Kingdom . |
| WO97/04020 | 2/1977 | WIPO . |

*Primary Examiner*—Yogendra Gupta
*Assistant Examiner*—D G Hamlin
*Attorney, Agent, or Firm*—Burns, Doane, Swecker & Mathis, LLP

[57] ABSTRACT

Provided are a conductive resin composition having little negative impact on the environment, a resin molding which includes conductive parts of the conductive resin composition and insulating parts, and their methods of production. The production costs for the resin molding are low. The conductive resin composition is formed by kneading a thermoplastic or thermosetting resin with a low melting point alloy, wherein the low melting point alloy is moldable with the resin and consists essentially of tin and is free of lead. An insulating body is formed through primary molding of a thermoplastic or thermosetting resin, and is integrated with conductive parts of the conductive resin composition through secondary molding; or alternatively, conductive parts are formed through primary molding of the conductive resin composition and an insulating body is formed while being integrated with the conductive parts through secondary molding.

6 Claims, 5 Drawing Sheets

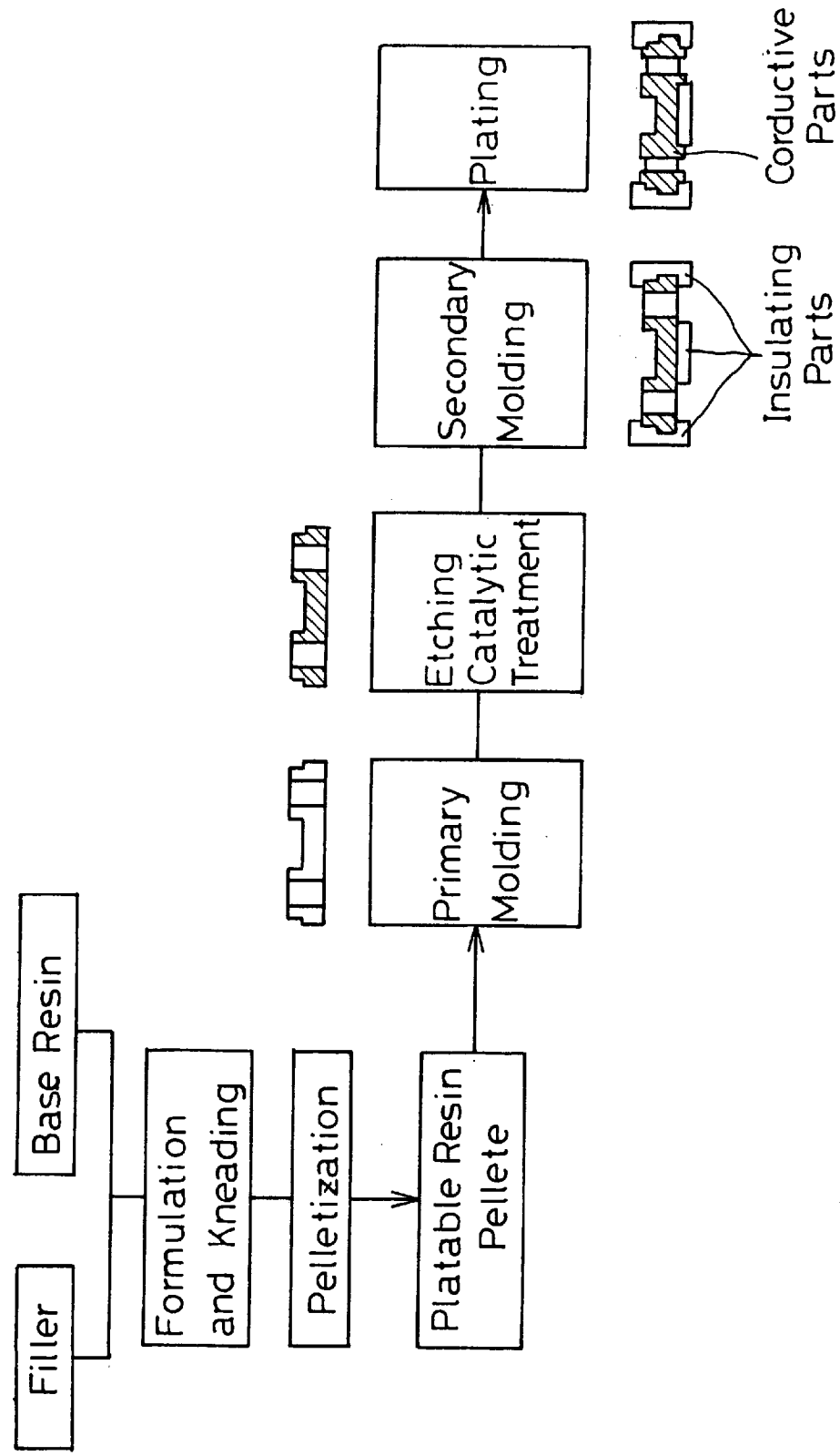

//  6,096,245

RESIN COMPOSITIONS, RESIN MOLDINGS AND THEIR METHODS OF PRODUCTION

The present application corresponds to Japanese Application No. 09(1997)-41145, filed Feb. 25, 1997, the entire content of which is incorporated herein by reference.

FIELD OF THE INVENTION

The present invention generally relates to resin compositions and to methods for producing such compositions. More particularly, the present invention pertains to resin moldings composed of conductive parts and insulating parts, and to methods for producing such resin moldings.

BACKGROUND OF THE INVENTION

The production of resin moldings of the type having conductive parts typically involves the use of high-conductive plastics. These high-conductive plastics contain, as a conductive filler, short metal fibers of copper, stainless steel or the like. For example, the Journal of the Plastic Molding Engineering Society of Japan (Molding, '93), pp. 143–144, describes a conductive resin composition containing a conductive filler of Pb—Sn solder powder (e.g., Pb: 70%, Sn: 30%). Also, Japanese Patent Publication (JP-B) 07-49491 describes a conductive resin composition containing a combination of conductive fibers and low melting point metal consisting essentially of Pb—Sn.

One general method for producing resin moldings having conductive parts is disclosed in Japanese Laid Open Patent Application (JP-A) 63-50482 and 01-207989. The method involves forming a primary molding for the backbone from a plastic molding material capable of being easily plated by chemical plating (i.e., an easily platable material), injecting a plastic molding material that is hardly platable by chemical plating (i.e., a hardly platable material) into the area of the outer surface of the primary molding that is not to be plated, and integrating these to produce a secondary molding. Thereafter, the exposed area of the easily platable material of the secondary molding is plated.

The conventional method of forming the conductive parts through plating is illustrated in FIG. 6. As illustrated therein, a filler and a base resin (for example, a thermoplastic resin) are first formulated in a predetermined ratio, kneaded and then pelletized into easily platable resin pellets (conductive material). Next, the resin pellets are formed into a primary molding to be the backbone through injection molding. The surface of this primary molding is etched and activated by catalytic treatment to facilitate the plating thereover. Next, the primary molding is subjected to secondary molding. Finally, the activated area of the surface is plated to form conductive parts. This method thereby produces a resin molding having conductive parts.

However, the conventional conductive composition comprising the conductive fibers and low melting point metal that consists essentially of Sn—Pb has a negative impact on the environment in that it contains lead, which is a harmful material. Substitutes for this material are presently needed.

In addition, the conventional method of producing resin moldings which have conductive parts requires an additional plating step for forming the conductive parts. This additional plating step undesirably increases the production costs associated with the method.

SUMMARY OF THE INVENTION

To avoid or conspicuously ameliorate the problems associated with the related art, it is an object of the present invention to provide a novel resin composition in which negative impacts on the environment is greatly reduced. It is a further object of the invention to provide resin moldings having conductive parts of the inventive resin composition and insulating parts. It is a further object of the invention to provide methods of producing the inventive resin composition and resin moldings. Through the invention, production costs for the resin moldings can be minimized.

In accordance with one aspect of the invention, a conductive resin composition is provided. The conductive resin composition is prepared by kneading a thermoplastic or thermosetting resin with a low melting point alloy, which is moldable along with the resin being molded and which consists essentially of tin but does not contain lead. Such a composition greatly reduces the negative environmental impact in comparison with conventional compositions.

Preferably, the low melting point alloy comprises an Sn—Cu base. Depending on the alloying ratio, the alloy may have a lowered melting point and may be in melt during molding of the composition, resulting in a composition which is easy to mold.

In accordance with a second aspect of the invention, provided is a resin molding composed of conductive parts of a conductive resin composition, and insulating parts of a thermoplastic or thermosetting resin. The conductive resin composition is prepared by kneading a thermoplastic or thermosetting resin with a low melting point alloy, which is moldable along with the resin being molded and which consists essentially of tin but does not contain lead.

According to this aspect of the invention, a primary molding for conductive parts is formed in the primary molding step and is integrated with insulating parts in the secondary molding step. The resulting resin molding thus composed of the conductive parts and the insulating parts has few negative influences on the environment.

In accordance with a third aspect of the invention, a method for producing a resin molding is provided. The method comprises a step of kneading a conductive filler with a base resin, a step of pelletizing the resulting resin mixture to give a conductive material where the base resin is a thermoplastic resin, or directly forming it into a conductive material where the base resin is a thermosetting resin, a step of molding a thermoplastic or thermosetting resin into a body through primary molding, and a step of integrating the resulting body with conductive parts of the conductive material through secondary molding.

According to the third aspect of the invention, the insulating resin body is formed through primary molding and is integrated with conductive parts in the secondary molding step. The resin molding thus produced is comprised of conductive parts and insulating parts. Accordingly, a plating step is not required and the production costs associated with this method are less than conventional methods.

In accordance with a fourth aspect of the invention, a further method for producing a resin molding is provided. The method comprises a step of kneading a conductive filler with a base resin, a step of pelletizing the resulting resin mixture to give a conductive material where the base resin is a thermoplastic resin, or directly forming it into a conductive material where the base resin is a thermosetting resin, a step of molding the conductive material into conductive parts through primary molding, and a step of forming a body of a thermoplastic or thermosetting resin integrated with the conductive parts through secondary molding.

In accordance with this aspect of the invention, the conductive parts are formed through primary molding and are integrated with an insulating resin body in the secondary molding step. The resin molding thus produced is comprised of conductive parts and insulating parts. Accordingly, a plating step is not required, and the production costs associated therewith are not as high as those of conventional methods.

Preferably, a dispersing aid is used in the kneading step to improve dispersion of the resin mixture to be pelletized. Using a uniform dispersion of the resin mixture improves the quality of the resin moldings formed.

BRIEF DESCRIPTION OF THE DRAWINGS

FIG. 6 is a flowchart of a conventional molding process.

DETAILED DESCRIPTION OF THE INVENTION

Various embodiments of the invention will be described in detail below, with reference to the drawings attached hereto.

Figure 1:
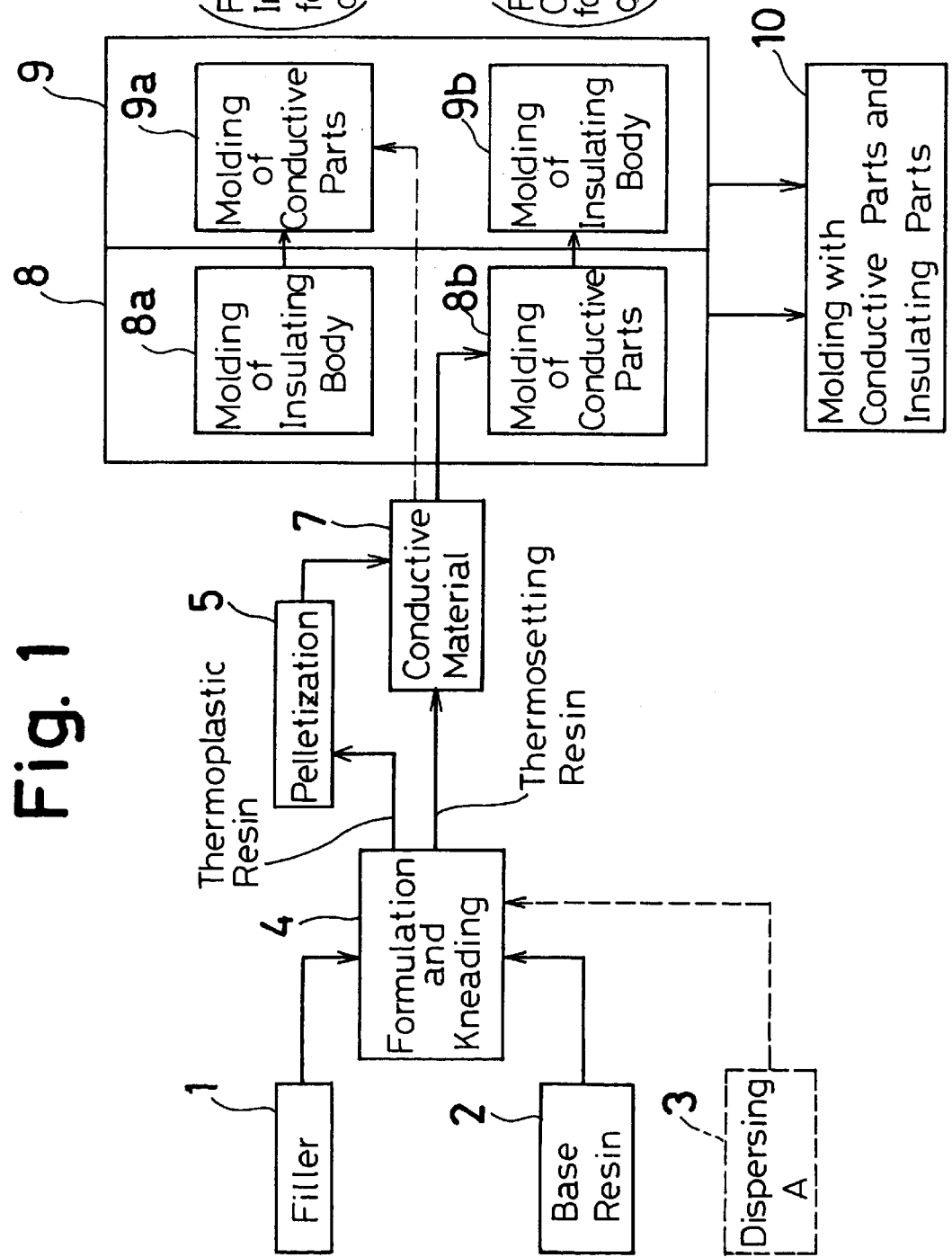
FIG. 1 is a flowchart illustrating one embodiment of the present invention.

FIG. 1 illustrates a flowchart for a process of preparing a conductive material 7 in accordance with one aspect of the present invention. The conductive material 7 comprises a filler 1 and a base resin 2, which is a thermoplastic or thermosetting resin.

As the filler 1, a low melting point alloy is used, which is moldable along with the resin being molded. The low melting point alloy consists essentially of tin, but does not contain lead. The low melting point alloy is such that it can be mixed and kneaded with the base resin, can be in melt while the resulting mixture is molded and is easy to mold along with the resin. For example, Sn—Cu based alloys are suitable, one example being an alloy of Sn—Cu—Ni—P (Fukuda Metal Flakes Industry's Sn—Cu—Ni At. W-150).

As the material of the base resin 2, a thermoplastic or thermosetting resin is used. When the base resin 2 is a thermoplastic resin, it may be any one or more resins of, for example, acrylonitrile-butadiene-styrene (ABS), polybutylene terephthalate (PBT), polyethylene terephthalate (PET), polyphenylene sulfide, polyamide, liquid-crystalline polymer, polystyrene, polyetherimide, polybenzimidazole, polyether-ether ketone, polyether sulfone, etc.

A dispersing aid 3, which can be a metal powder of copper, nickel or the like, may be added to the low melting point alloy filler 1 and the base resin 2. The mixing ratio of base resin/filler/dispersing aid may be, for example, 45/40/15. The resulting mixture is molded through extrusion, and is then pelletized through a hot cutting method, or the like, into pellets 5 of a conductive material 7.

On the other hand, when the base resin 2 is a thermosetting resin (e.g., any one or more of phenolic resins, epoxy resins, unsaturated polyester resins, etc.), the process of producing the conductive material 7 is somewhat different from that noted above with respect to the thermoplastic resin. In this regard, the mixture as prepared by kneading 4 the base resin (i.e., the thermosetting resin) 2, the filler 1 and, optionally, the dispersing aid 3, may itself be the conductive material 7.

The conductive material 7 thus prepared is molded into a resin molding 10 having conductive parts and insulating parts, via primary molding 8 and secondary molding 9, as discussed below.

As shown in FIG. 1, insulating parts can first be formed from a thermoplastic or thermosetting resin which are then integrated with conductive parts formed from the conductive material (8a, 9a). Alternatively, the conductive parts can first be formed from the conductive material, which are then integrated with insulating parts formed from a thermoplastic or thermosetting resin (8b, 9b).

Figure 3:
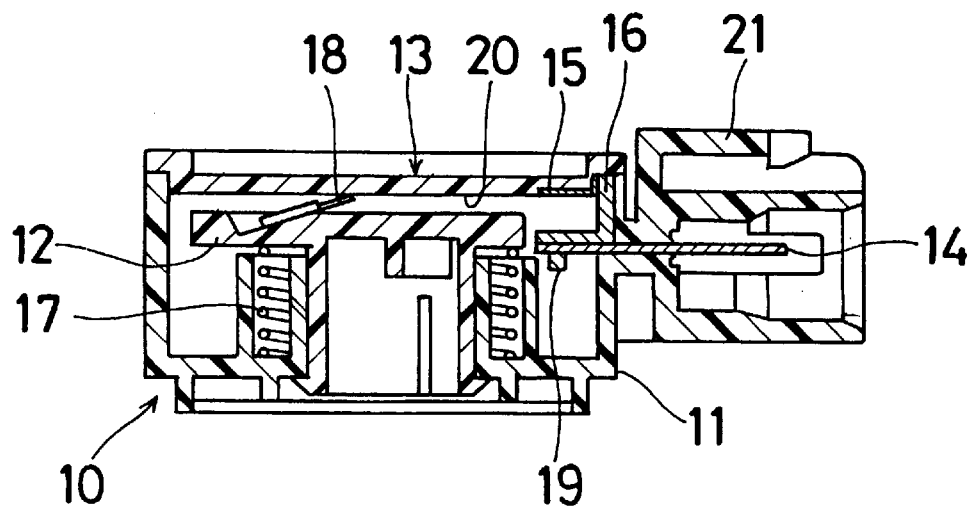
FIG. 3 is a cross-sectional view of the throttle sensor of FIG. 2, taken along line A—A.
Figure 4:
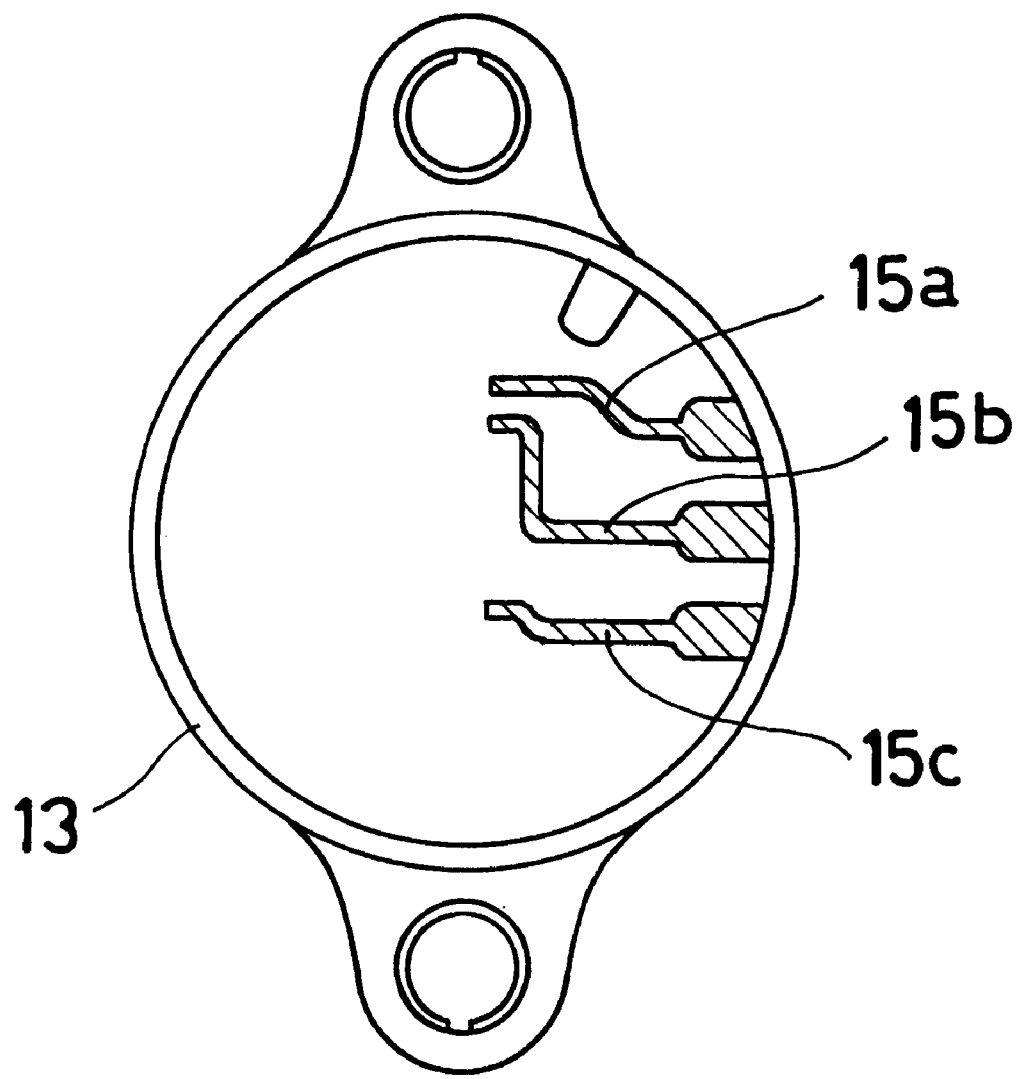
FIG. 4 is a plan view of the substrate of FIG. 2 without the resistor thereon.

One example of a resin molding 10 having conductive parts will now be described with reference to FIGS. 2–4, which illustrate the invention as applied to a throttle sensor for vehicles.

Figure 2:
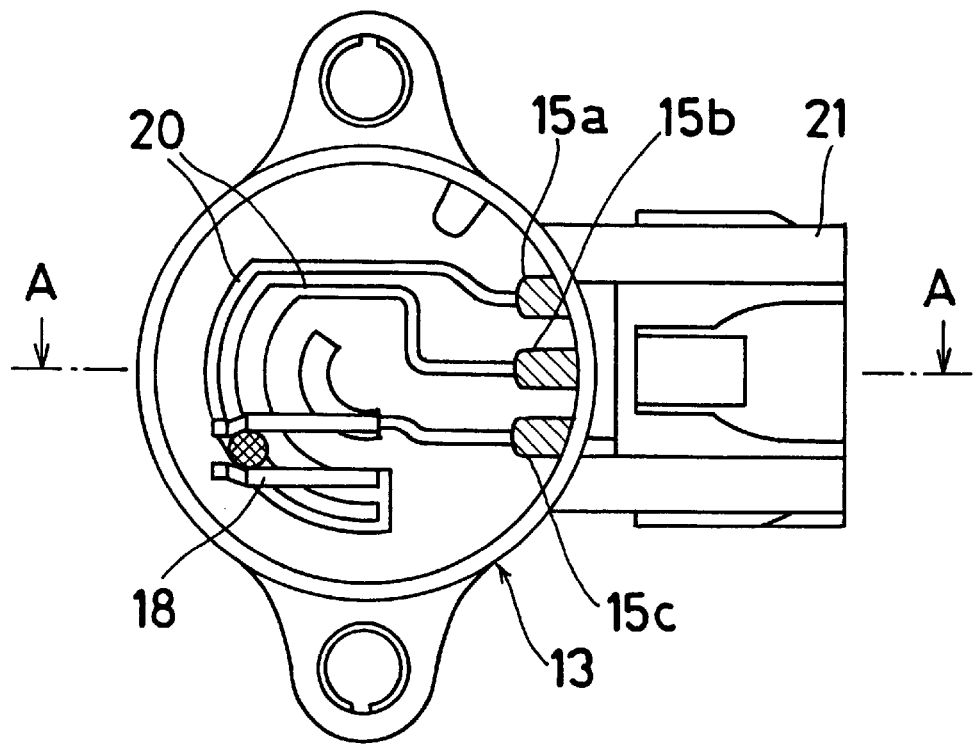
FIG. 2 is a plan view of a throttle sensor to which the invention has been applied.

FIG. 2 is a plan view illustrating a throttle sensor 10 of a resin molding described above, and FIG. 3 is a cross-sectional view taken along line A—A of FIG. 2. In the throttle sensor 10, a connector case 21 is integrated with a resin housing 11. The resin housing 11 is made from a thermoplastic resin (e.g., PBT). A substrate 13 is made from a thermoplastic resin through injection molding, while being integrated with a first conductive resin (conductive part) 15. A resistor 20 is formed on the substrate 13 by screen-printing and baking a powder of silver, or the like, thereon. A brush 18 is in slidable contact with the resistor 20. A brush holder 12 is coupled with the housing, and is provided with the brush 18 fixed at a top portion thereof. One end of the brush 18 is pressed against a returnable spring 17 supported inside the housing. Metallic terminals 14 are further provided, and a second conductive resin (conductive part) 16 is integrated with the terminals 14.

The first and second conductive resins 15, 16 comprise a base resin 2, a filler 1 of a low melting point alloy and a dispersing aid 3 of a powder of copper, nickel or the like. The low melting point alloy consists essentially of tin, has little negative impact on the environment and is moldable. To prepare the resins, the base resin 2, the filler 1 of a low melting point alloy and the dispersing aid 3 are mixed, for example, in a ratio of 45/40/15 in terms of percent by volume.

Although PBT is described for use in the exemplary embodiment, any other thermoplastic resin, for example, polyethylene terephthalate, polyphenylene sulfide, polyamide, liquid-crystalline polymer, polystyrene, polyetherimide, polybenzimidazole, polyetherether ketone, polyether sulfone or the like, can be used.

The mixture comprising the low melting point alloy and base resin has a high conductivity and forms a conductive material having a volume intrinsic resistivity of about $10^{-5}$ Ω-cm, in which the transmission loss is very small. Depending on the amount of the low melting point alloy therein, the conductive material can be easy to mold since the low melting point alloy therein may be in semi-melt during molding.

To unify distribution of the low melting point alloy in the first and second conductive resins 15, 16, the alloy can be stirred well and be quickly solidified during the molding step. Thus, it is not necessary to scrape the surfaces of resins 15 and 16 to conduct electricity through surface contacts among the resins and terminals 14. Furthermore, due to quick solidification of the low melting point alloy, the temperature setting of the injector may be increased to improve flowability during injection molding. Conductive resins 15 and 16 may thereby be filled in sharp edges, thin gaps and complex spaces.

A method for producing the sensor 10 will now be described. Terminals 14 are set in a predetermined position in the cavity of a mold (not shown). The cavity is a space in the mold into which a resin is injected. In that condition, a melt of the second conductive resin 16 is injected into the cavity, and is then cooled along with the terminals 14. This is the primary molding, through which the second conductive resin 16 is solidified while being integrated with the terminals 14 to form the conductive part. In this step, a projection 19 is formed of the second conductive resin 16 by which disintegration of the terminals 14 can be prevented.

The terminals 14 and the second conductive resin 16 thus integrated are set in a predetermined position in the cavity of a mold (not shown), and a melt of a thermoplastic resin is then injected into the cavity. Next, the resin is cooled and solidified. This is the secondary molding, through which the terminals 14 and the second conductive resin part 16 are integrated with the housing 11 having the connector case 21.

The substrate 13 and the first conductive resin (conductive part) 15 are formed from a thermoplastic resin through injection molding in the same manner as described above, while also being integrated together. FIG. 4 illustrates the substrate 13 with no resistor 20 thereon. Three parts are made of the first conductive resin 15, which include a conductive part 15a to be electrically connected with the positive (plus) terminal of a battery, a conductive part 15b to be electrically connected with the negative (minus) terminal of the battery and a conductive part 15c into which is input the throttle opening information signal prior to being fitted onto the substrate 13 and which is to transmit the signal. These three parts are electrically connected with three different terminals 14 (single terminal only shown in FIG. 3).

The parts of the sensor 10 are assembled. Briefly, the returnable spring 17 is fitted inside the housing 11, and the brush holder 12 is built in the housing 11. Next, the substrate 13 is maintained in contact with the edge of the housing 11, and the first conductive resin 15 is laid over the second conductive resin 16 such that they are maintained in contact with each other. In this condition, the substrate 13 is ultrasonically welded to the housing 11.

In the construction noted above, the first conductive resin 15 and the second conductive resin 16 are also ultrasonically welded together and are electrically connected with each other. Accordingly, the terminals 14 are electrically connected with the resistor 20 via the first conductive resin 15 and the second conductive resin 16.

Figure 5:
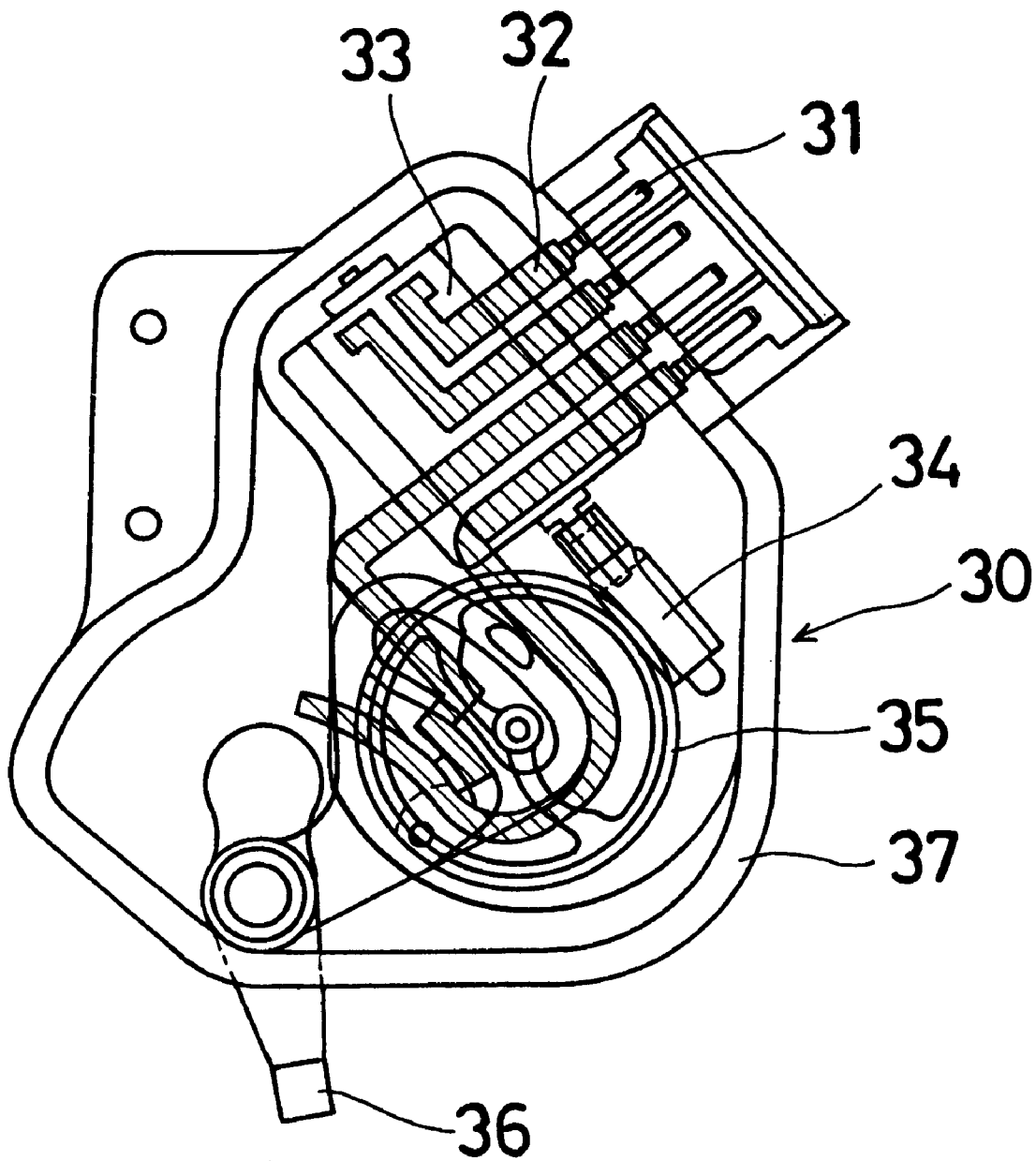
FIG. 5 is a plan view of a door lock actuator to which the invention has been applied.

FIG. 5 illustrates a second embodiment of the present invention, wherein a resin molding having conductive parts is applied to a door lock actuator 30.

The illustrated actuator 30 is provided with a working mechanism therein. In this regard, the internal motor 33 is driven via a signal as input into the terminal 31. As a result, a worm 34 fitted to a rotary shaft of the motor 33 is rotated, whereby a worm wheel 35 engaged with the worm 34 is rotated in the opposite direction, thereby driving the working part 36. In such manner, the door lock (not shown) can be locked and unlocked.

The housing (insulating part) 37, the terminal 31 and the conductive part 32 are integrated together to be a resin molding, which resin molding can be produced according to the below-described process.

First, a terminal 31 is set in a predetermined position in a mold (not shown), and is integrated with a conductive part 32 according to the molding method described above. The conductive part 32 is molded around the thus set terminal 31 and is integrated therewith. To form the conductive part 32, a conductive material is used, which is prepared by mixing and kneading a base resin (e.g., PBT), a low melting point alloy filler and a dispersing aid of a powder of copper, nickel or the like. The low melting point alloy consists essentially of tin, is moldable and has little negative impact on the environment. Exemplary of such a material is an Sn—Cu based alloy, for example, an Sn—Cu—Ni—P alloy.

Next, the terminals 14 thus integrated with the conductive part 32 are set in a predetermined position in the cavity of the mold. A melt of a thermoplastic resin is injected into the cavity, cooled and solidified to form an insulating part around the terminals 14. In this step, the terminals 14 are further integrated with the insulating part of the thermoplastic resin, and a resin molding 10 having both the conductive part and the insulating part is obtained.

In the embodiments illustrated herein, a thermoplastic resin can be used as the base resin. A thermosetting resin can alternatively be used as the base resin, in which case, the resin mixture can be heated after having been injected into the mold to form the conductive part.

Where two-dimensional conductive parts are to be formed according to the invention, any of the conductive parts or the insulating parts may be formed in the primary molding or the secondary molding. However, where three-dimensional conductive parts are to be formed, it is preferable that the conductive parts are first formed in the primary molding, and thereafter the insulating parts are formed in the secondary molding.

It is also preferable to form the insulating parts in the primary molding process and then to form the conductive parts in the secondary molding process in case a shape of the conductive part requires good flowability of the conductive resin. The insulating parts may prevent the conductive resin from cooling quickly so that sufficient flowability is maintained during molding.

As described in detail above, the present invention provides a resin composition prepared by mixing and kneading a thermoplastic or thermosetting resin with a low melting point alloy, which is moldable along with the resin being molded and which consists essentially of tin, and does not contain lead. As for the lead-free low melting point alloy, the resin composition of the invention has little negative impact on the environment.

As the low melting point alloy, an Sn—Cu based alloy is preferred. Depending on the alloying formulation, the alloy may have a lowered melting point and may be in melt while the resin composition comprising it is molded. Accordingly, the resin composition comprising an alloy of that type cen be easy to mold.

The resin molding of the invention comprises conductive parts of the conductive resin composition and insulating parts of a thermoplastic or thermosetting resin. The conductive resin composition is prepared by mixing and kneading a thermoplastic or thermosetting resin with a low melting point alloy, which is moldable along with the resin being molded and which consists essentially of tin, but does not contain lead. To produce the resin molding, a primary molding for conductive parts is first formed in the primary molding step and is thereafter integrated with insulating parts in the secondary molding step. The resin molding thus produced having both conductive parts and insulating parts has little negative impact on the environment.

One method for producing the resin molding of the invention comprises kneading a conductive filler with a base resin, pelletizing the resulting resin mixture to give a conductive material (where the base resin is a thermoplastic resin) or directly forming it into a conductive material (where the base resin is a thermosetting resin), molding a thermoplastic or thermosetting resin into a body through a primary molding, and integrating the resulting body with conductive parts of the conductive material through a secondary molding. According to this method, the insulating resin body is formed through primary molding and is integrated with conductive parts in the next secondary molding step.

The resin molding thus produced is composed of conductive parts and insulating parts. Accordingly, the method does not require a plating step, and the production costs for it are not as high as conventional methods.

Another method for producing the resin molding of the invention comprises kneading a conductive filler with a base resin, pelletizing the resulting resin mixture to give a conductive material (where the base resin is a thermoplastic resin) or directly forming it into a conductive material (where the base resin is a thermosetting resin), molding the conductive material into conductive parts through primary molding, and forming a body of a thermoplastic or thermosetting resin as integrated with the conductive parts through secondary molding.

According to the method, the conductive parts are formed through primary molding and are integrated with an insulating resin body in the next, secondary molding step. The resin molding thus produced is composed of conductive parts and insulating parts. Accordingly, the method does not require a plating step, and the production costs for it are not as high as conventional methods.

In accordance with these methods, a dispersing aid is preferably used in the kneading step to improve the dispersion of the resin mixture to be pelletized. Use of a uniform dispersion of the resin mixture improves the quality of the resin moldings formed.

While the invention has been described in detail and with reference to specific embodiments thereof, it will be apparent to one skilled in the art that various changes and modifications can be made therein without departing from the spirit and scope thereof.

What is claimed is:

1. A method of producing a conductive resin composition, comprising the steps of:

kneading a thermoplastic or thermosetting resin with a low melting point alloy which has a melting point lower than a molding temperature of said resin and a dispersing aid which includes at least one chemical element of said low melting point alloy; and molding the resulting mixture;

wherein the low melting point alloy consists essentially of tin, is free of lead and is in a melt or semi-melt while the resulting mixture is molded.

2. The method according to claim 1, wherein the low melting point alloy has a Sn—Cu base.

3. A method of producing a conductive resin composition, comprising kneading a thermoplastic or thermosetting resin with a low melting point alloy, wherein the low melting point alloy is Sn—Cu—Ni—P.

4. The method according to claim 1, wherein the thermoplastic or thermosetting resin is a thermoplastic resin.

5. The method according to claim 1, wherein a dispersing aid is employed in the kneading step.

6. A conductive resin composition prepared by the method according to claim 2.

* * * * *